United States Patent [19]

Murphy

[11] Patent Number: 5,126,601
[45] Date of Patent: Jun. 30, 1992

[54] DRIVER AND RECEIVER FOR A DIFFERENTIAL-SIGNAL ELECTRICAL INTERFACE

[75] Inventor: Timothy F. Murphy, Escondido, Calif.

[73] Assignee: NCR Corporation, Dayton, Ohio

[21] Appl. No.: 613,181

[22] Filed: Nov. 15, 1990

[51] Int. Cl.⁵ .......................................... H03K 19/092
[52] U.S. Cl. .................................. 307/475; 307/443; 307/270; 307/479
[58] Field of Search ................ 307/475, 443, 270, 479

[56] References Cited

U.S. PATENT DOCUMENTS

| | | | |
|---|---|---|---|
| 4,280,221 | 7/1981 | Chun et al. .......................... 375/17 |
| 4,427,848 | 1/1984 | Tsakanikas ....................... 179/2 DP |
| 4,440,987 | 4/1984 | Heep et al. ........................ 179/2 DP |
| 4,504,959 | 3/1985 | Heckenbach ........................ 307/475 |
| 4,535,294 | 8/1985 | Ericksen et al. .................... 307/475 |
| 4,598,286 | 7/1986 | Miller et al. .................... 340/825.06 |
| 4,749,876 | 6/1988 | Gale et al. .......................... 307/270 |
| 4,797,582 | 1/1989 | Ngugen et al. ..................... 307/475 |
| 4,945,261 | 7/1990 | Wright ................................. 307/443 |
| 4,992,677 | 2/1991 | Ishibashi et al. .................... 307/443 |
| 5,008,562 | 4/1991 | Hosoda et al. ...................... 307/270 |

Primary Examiner—Stanley D. Miller
Assistant Examiner—Scott A. Ouellette
Attorney, Agent, or Firm—Gregory P. Gadson; Gregory A. Welte

[57] ABSTRACT

Driver and receiver circuits for a differential-signal electrical interface contain comparators and resistive networks to eliminate the need for operational amplifiers, thus lowering cost and raising reliability. The preferred embodiments for the driver and receiver are optimized for use with transistor-transistor logic (TTL) signals and the International Telegraph and Telephone Consultative Committee (CCITT) 1985 Recommendation V.35, which recommendation was designed for use with wideband modems.

13 Claims, 4 Drawing Sheets

DRIVER AND RECEIVER FOR A DIFFERENTIAL-SIGNAL ELECTRICAL INTERFACE

FIELD OF THE INVENTION

The present invention generally relates to digital communication and data transfer over telephone networks.

BACKGROUND OF THE INVENTION

The International Telegraph and Telephone Consultative Committee (CCITT) is a standards organization who, inter alia, publishes recommendations for data communication over telephone networks. The 1984 Series V Recommendations include recommendations for wideband modems. Section 3 of this document is titled "Recommendation V.35—Data Transmission at 48 Kilobits per second Using 60-108 Khz Group Band Circuits", which is hereby expressly incorporated by reference. The appendix to this letters patent (identical to Appendix II of the CCITT V.35—1984 recommendation) describes the electrical characteristics for the balanced, double-current interchange circuits which are used with this recommendation. The Recommendation V.35 uses differential signals (two signals), which give a much higher signal-to-noise ratio than signals referenced to ground.

The present invention allows an efficient conversion from transistor-transistor logic (TTL) signals to the V.35 electrical interface, and vice versa.

SUMMARY OF THE INVENTION

In light of the above, it is an object of the present invention to provide a driver and receiver for a differential-signal electrical interface, which are inexpensive.

It is also an object of the present invention to provide a driver and receiver for a differential-signal electrical interface, which have few components.

It is a further object of the present invention to provide a driver and receiver for a differential-signal electrical interface, which are highly reliable.

It is another object of the present invention to meet the above objects without the use of operational amplifiers.

An additional object of the present invention is to comply with the 1984 CCITT Recommendation V.35.

There is provided in accordance with the present invention, a driver for driving and converting a first logic signal to first and second differential signals, the driver including:

a first comparator connected at a non-inverting input to the first logic signal and at a second input to a reference voltage;

a second comparator connected at an inverting input to the first logic signal and at a second input to a reference voltage; and a resistive network connected to the outputs of the first and second comparators for voltage and impedance converting output signals from the first and second comparators to the first and second differential signals;

wherein the output signals from the first and second comparators are complementary.

There is also provided in accordance with the present invention, a receiver for receiving and converting first and second differential signals to a first logic signal, the receiver including:

a resistive network connected to the first and second differential signals for impedance converting the first and second differential signals to predefined values; and a comparator connected at an inverting input to the first differential signal output by the resistive network, and connected at a non-inverting input to the second differential signal output by the resistive network, the comparator outputting signals representative of the first logic signal.

The details of the present invention will be revealed in the following description, with reference to the drawings.

DESCRIPTION OF THE PREFERRED EMBODIMENTS

Figure 1:
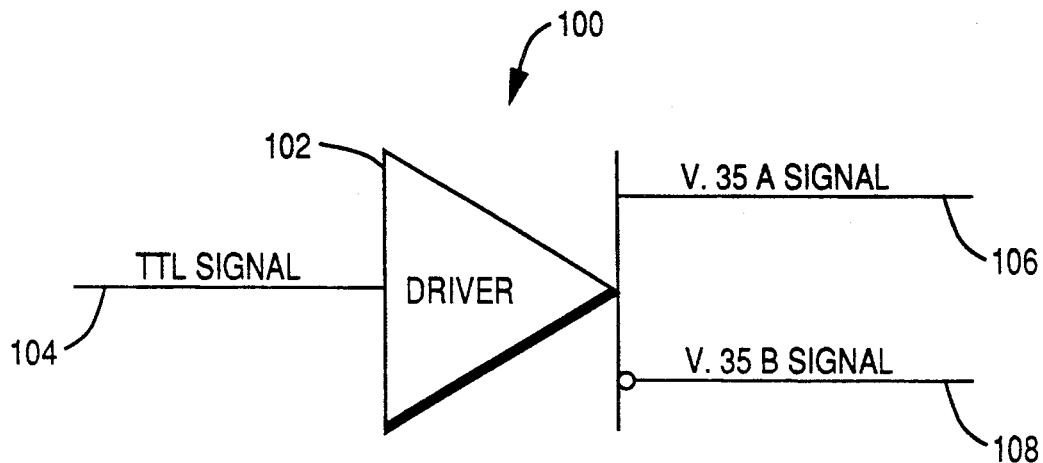
FIG. 1 is a schematic block diagram of the present-inventive driver circuit.
Figure 2:
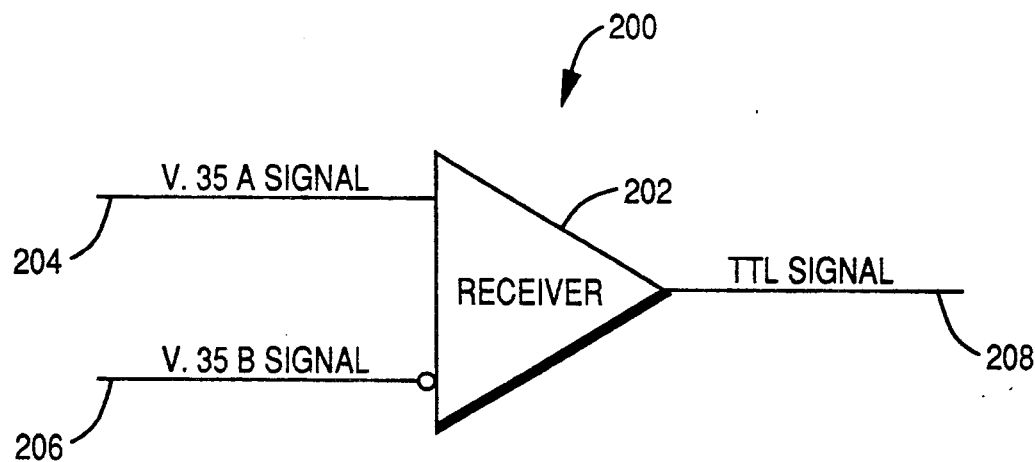
FIG. 2 is a schematic block diagram of the present-inventive receiver circuit.

FIGS. 1 and 2 show a driver and receiver circuit 100 and 200, respectively, suitable for use with the aforementioned V.35 recommendation. The driver 102 accepts an input TTL signal (0-0.5 volts=logic low; 2.7-5 volts=logic high) over an input line 104, and outputs two differential signals over output lines 106 and 108. The output signals on the lines 106 and 108 are complementary, and alternate between plus and minus 0.275 volts, for a differential voltage of 0.55 volts. Similarly, the receiver 202 receives two V.35 signals over input lines 204 and 206 and outputs them as one TTL signal over the output line 208.

Figure 3A:
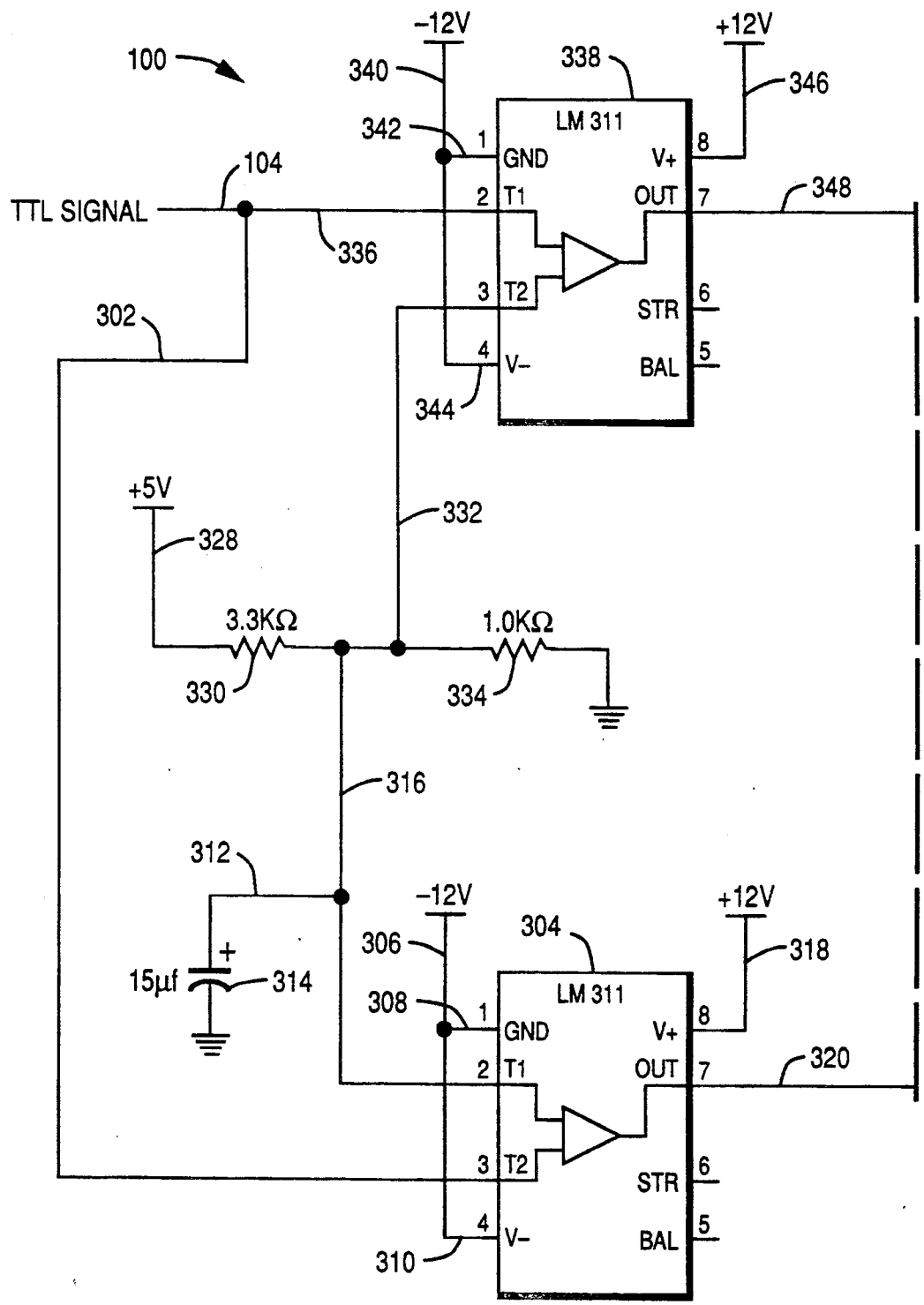
FIG. 3 is a detailed schematic diagram of the driver circuit in FIG. 1.
Figure 3B:
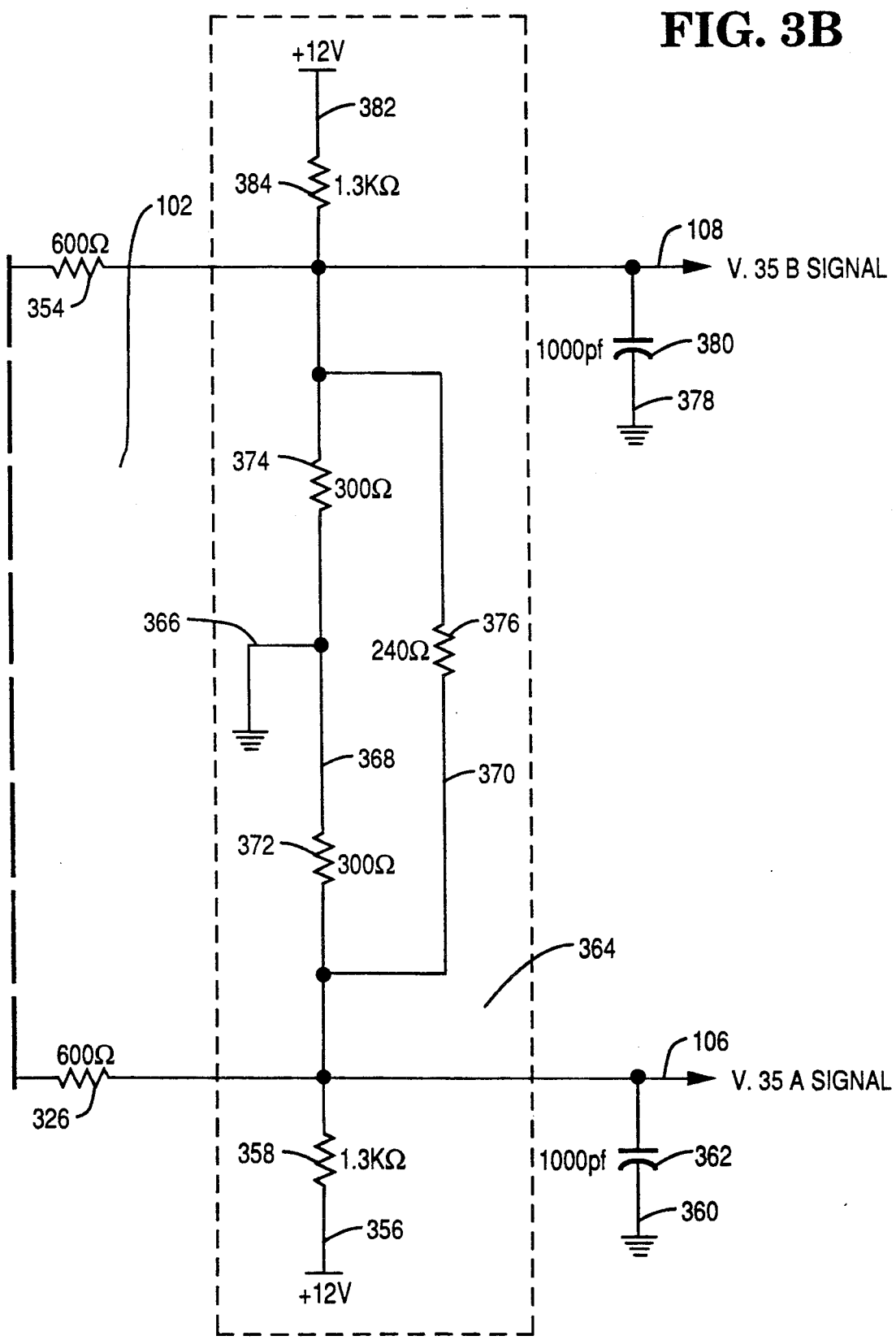

Turning now to FIG. 3, the driver circuit 100 is shown in more detail. The value of all resistors and capacitors in the preferred embodiments for both the driver and receiver are indicated in the drawing figures next to the associated component. The driver 102 receives the input TTL signal over the input line 104. The TTL signal propagates over a line portion 302 to the inverting input of a comparator 304, which compares the input TTL signal to a 1.4 volt reference on a line 316. The comparator 304 is connected, via lines 306, 308 and 310, to a −12 volt power supply, and also to the reference voltage via line 316. The comparator 304 is also connected to a +12 volt power supply via line 318. The output 320 of the comparator 304 is either floating, or, with the influence of a resistor 326, at approximately −12 volts.

The operation of the comparator 338 is identical to that of the comparator 304, except that its output on line 348 is complementary to the output of the comparator 304. That is, when the output line 320 is floating, the output line 348 is at −12 volts, and when the output line line 320 is at −12 volts, the output line 348 is floating. This complementary action is caused by inputting the TTL signal (via line 336) to the non-inverting input of the comparator 338, rather than the inverting input. Recall that the input TTL signal is received by the comparator 304 at its inverting input.

Two resistors 330 and 334 connected to a line 328 supplied by a +5 volt source, act as a voltage divider circuit to cause a reference voltage of 1.4 volts to appear on the reference voltage lines 316 and 332. A buffer capacitor 314 connected to the line 316 via line 312, serves to stabilize the reference voltage, thus minimizing fluctuations.

A resistive network 364 converts the signals output by the comparators 304 and 338 to plus and minus 0.275 volts to establish a 0.55 volt differential, as per the V.35 recommendation. In addition to converting the voltages received, the resistive network also converts various impedance levels to meet the V.35 recommendation. The impedances converted are between the output line 106 and ground, between the output line 108 and ground, and between the output lines 106 and 108. Again, the appendix to this letters patent contains the V.35 electrical characteristics.

The resistors 372 (connected to line 368), 374 (also connected to line 368) and 376 (connected to line 370) are connected to ground via line 366, and form voltage dividers with resistors 358 and 384, to produce the V.35 signals. The resistors 358 and 384 are connected via lines 356 and 382, respectively, to +12 volt power sources. The capacitors 362 and 380 are connected between the output lines 106 and 108, and ground via lines 360 and 378, respectively, and serve as high frequency filters to reduce electromagnetic interference (EMI).

Figure 4:
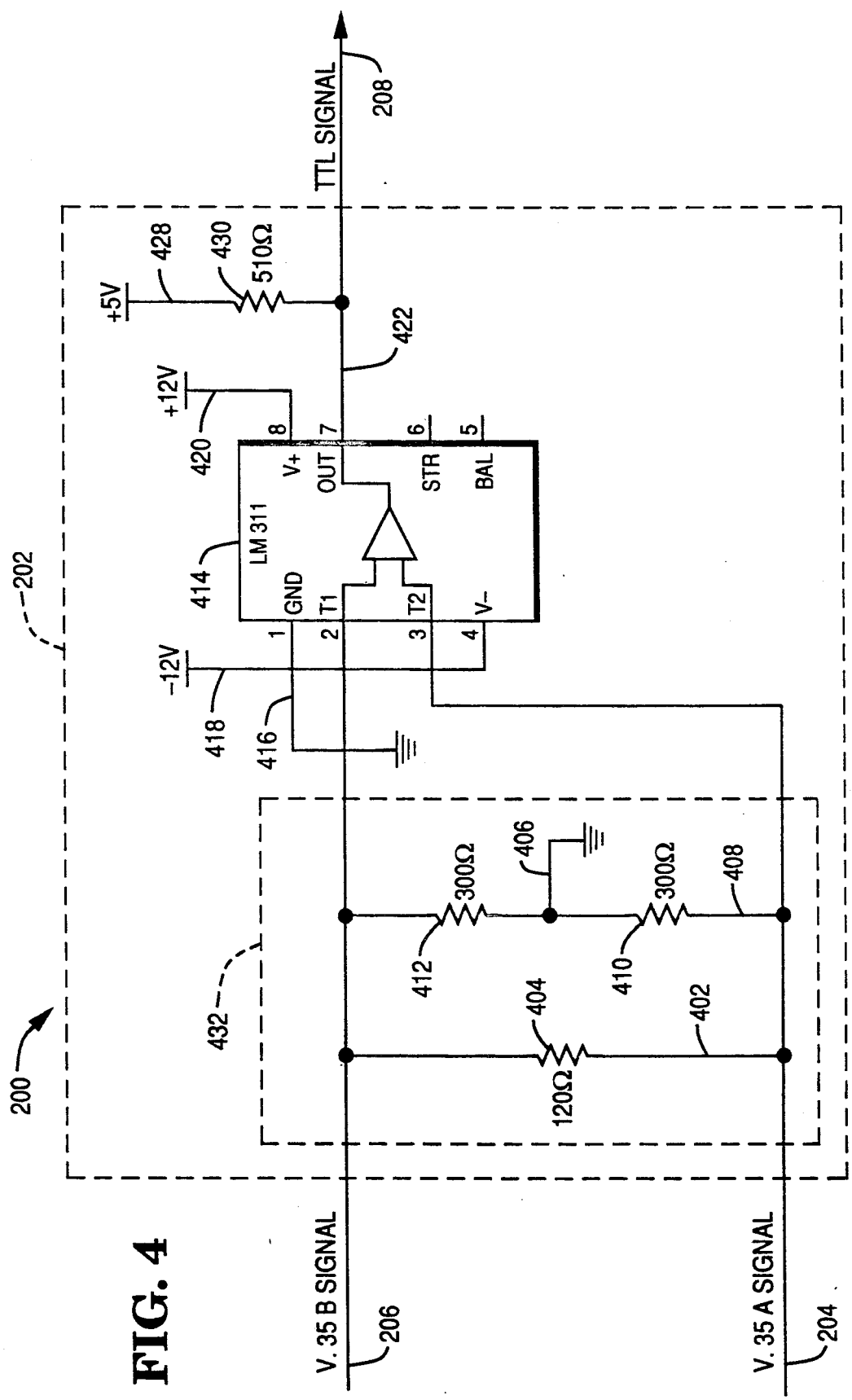
FIG. 4 is a detailed schematic diagram of the receiver circuit in FIG. 2.

The novel receiver circuit 200 in FIG. 4 also utilizes a resistive circuit, and a comparator of the same type employed for the driver circuit 100. The V.35 differential signals input over lines 204 and 206 are impedance converted by the resistive network 432 so that the V.35 standard for impedances can be met. The resistive circuit 432 contains, as shown in FIG. 4, a resistor 404 connected to a line 402, and two resistors 410 and 412 connected to a line 408 and to ground via a line 406.

A comparator 414 receives the impedance-converted V.35 signals, and its output line 422 is either at ground (0) voltage, or floating. The comparator 414 is connected to ground via a line 416, and is also connected to a −12 volt power source via a line 418, and a +12 volt power source via a line 420.

A resistor 430 is connected to a +5 volt power source via a line 428. With the aid of the resistor 430, the floating condition (of line 422) is converted to +5 volts, while the ground condition remains at approximately 0 volts. Thus the output signals appearing over line 208 are within the acceptable range for the TTL logic family.

Variations and modifications to the present invention are possible given the above disclosure. However, such variations and modifications are intended to be within the scope of the invention claimed by this letters patent. For example, the present inventive driver and receiver are not limited to use with the CCITT 1984 V.35 recommendation, but can be adapted to work with any differential-signal electrical interface.

APPENDIX
(APPENDIX II to Recommendation V.35)
Electrical characteristics for balanced double-current interchange circuits

| II.1 | Scope |
| --- | --- |
| | The electrical characteristics specified here apply to interchange circuits to Recommendation V.35. |
| II.2 | Cable |
| | The interface cable should be a balanced twisted multi-pair type with a characteristic impedance between 80 and 120 ohms at the fundamental frequency of the timing waveform at the associated terminator. |

-continued
APPENDIX
(APPENDIX II to Recommendation V.35)
Electrical characteristics for balanced double-current interchange circuits

| II.3 | Generator | |
| --- | --- | --- |
| | This circuit should comply with the following requirements: | |
| | a) | source impedance in the range 50 to 150 ohms; |
| | b) | resistance between short-circuited terminals and circuit 102: 150 ± 15 ohms (the tolerance is subject to further study); |
| | c) | when terminated by a 100-ohm resistive load the terminal-to-terminal voltage should be 0.55 volt ± 20% so that the A terminal is positive to the B terminal when binary 0 is transmitted, and the conditions are reversed to transmit binary 1; |
| | d) | the rise time between the 10% and 90% points of any change of state when terminated as in c) should be less than 1% of the nominal duration of a signal element or 40 nanoseconds, whichever is the greater; |
| | e) | the arithmetic mean of the voltage of the A terminal with respect to circuit 102, and the B terminal with respect to circuit 102 (d.c. line offset), should not exceed 0.6 volt when terminated as in c). |
| II.4 | Load | |
| | The load should comply with the following: | |
| | a) | input impedance in the range 100 ± 10 ohms, substantially resistive in the frequency range of operation; |
| | b) | resistance to circuit 102 of 150 ± ohms, measured from short-circuited terminals (the tolerance on this resistance is subject to further study). |
| II.5 | Electrical safety | |
| | A generator or load should not be damaged by connection to earth potential, short-circuiting, or cross-connection to other interchange circuits. | |
| II.6 | Performance in the presence of noise | |
| | A generator, as in §II.3 above, connected via a cable as in KII.2 above to a load, as in §II.4 above, should operate without error in the presence of longitudinal noise or d.c. common return potential differences (circuit 102 offset) as follows: | |
| | a) | with ±2 volts (peak) noise present longitudinally, i.e. algebraically added to both load input terminals simultaneously with respect to the common return; or |
| | b) | with ±4 volts circuit 102 offset; |
| | c) | if circuit 102 offset and longitudinal noise are present simultaneously, satisfactory operation should be achieved when: $\frac{\text{circuit 102 offset}}{2}$ + longitudinal noise (peak) = 2 volts or less. |

I claim:
1. A driver for driving and converting a first logic signal to first and second differential signals, comprising:
a first comparator coupled at a non-inverting input to said first logic signal and at a second input to a reference voltage;
a second comparator coupled at an inverting input to said first logic signal and at a second input to said reference voltage; and a substantially passive resistive network coupled to outputs of said first and second comparators for voltage and impedance matching output signals from said first and second comparators to said first and second differential signals, such that a source impedance of the driver lies in the approximate range of 50 to 100 ohms;

wherein the output signals from said first and second comparators are complementary.

2. The driver in claim 1 wherein the difference between said first and second differential signals is substantially 0.55 volts.

3. The driver in claim 1 wherein the value of said first and second differential signals ranges from plus 0.275 volts to minus 0.275 volts.

4. The driver in claim 2 wherein said first logic signal is a transistor-transistor logic (TTL) signal.

5. The driver in claim 1 further comprising a reference voltage generator for generating said reference voltage.

6. The driver in claim 1 further comprising high frequency filter means coupled to outputs of said resistive network for filtering high frequency components from said first and second differential signals, to reduce electro-magnetic interference (EMI).

7. The driver in claim 5 further comprising a buffer capacitor coupled to said reference voltage generator for stabilizing said reference voltage.

8. The driver in claim 1 wherein the difference between said first and second differential signals is substantially 0.55 volts, and wherein said first logic signal is a TTL signal, said driver further comprising:

a reference voltage generator for generating said reference voltage;

high frequency filter means coupled to outputs of said resistive network for filtering high frequency components from said first and second differential signals, to reduce EMI; and a buffer capacitor coupled to said reference voltage generator for stabilizing said reference voltage.

9. A receiver for receiving and converting first and second differential signals to a first logic signal comprising:

a resistive network coupled to said first and second differential signals for impedance matching said first and second differential signals; and a comparator coupled at an inverting input to said first differential signal output by said resistive network, and coupled at a non-inverting input to said second differential signal output by said resistive network, said comparator outputting signals representative of said first logic signal, and said resistive network reducing a load impedance which the receiver presents to the first logic signal.

10. The receiver in claim 9 wherein the difference between said first and second differential signals is substantially 0.55 volts.

11. The receiver in claim 9 wherein the value of said first and second differential signals ranges from plus 0.275 volts to minus 0.275 volts.

12. The receiver in claim 10 wherein said first logic signal is a transistor-transistor logic (TTL) signal.

13. The receiver in claim 9 wherein the difference between said first and second differential signals is substantially 0.55 volts, and wherein said first logic signal is a TTL signal.

* * * * *